United States Patent [19]
Gee et al.

[11] 4,214,706
[45] Jul. 29, 1980

[54] AIR DISTRIBUTION SYSTEM

[75] Inventors: Arthur Gee, Niagara Falls, N.Y.; Edward J. Largo; Boris M. Plesinger, both of Phoenix, Ariz.

[73] Assignee: Honeywell Information Systems Inc., Phoenix, Ariz.

[21] Appl. No.: 971,469

[22] Filed: Dec. 20, 1978

[51] Int. Cl.² ............................................. F23D 13/44
[52] U.S. Cl. ................................ 239/553.3; 98/40 C; 239/557; 239/590.3
[58] Field of Search ...................... 98/40 C, 40 D, 36; 34/195, 232; 239/548, 553.3, 553.5, 557, 568, 590.3

[56] References Cited
U.S. PATENT DOCUMENTS

| 2,511,380 | 6/1950 | Stadler | 239/553.3 X |
| 3,736,095 | 5/1973 | Leatherby | 239/553.3 X |
| 3,817,160 | 6/1974 | Searcy et al. | 239/598 X |

Primary Examiner—Richard A. Schacher
Attorney, Agent, or Firm—E. W. Hughes; W. W. Holloway, Jr.; R. T. Reiling

[57] ABSTRACT

An improved air distribution system for cooling electronic components mounted on printed circuit boards. The system includes an air plenum chamber of rectangular cross section. Openings are formed in the side walls of the chamber to permit air under pressure from within the chamber to flow outwardly in a direction substantially normal to the outer surfaces of the side walls and over the components to be cooled. A baffle in the form of a thin sheet of metal is mounted in the plenum substantially parallel to the side walls to divide the interior into two substantially equal portions. A large number of small round holes are formed through the baffle the area of the holes occupying substantially 36 percent of the total area of the baffle. An air pump supplies air under pressure to the interior of the plenum chamber. The baffle modifies the pressure distribution and air flow within the chamber so that the velocity of air through the openings formed in the side walls does not substantially vary with the position of the openings along the length of the plenum.

15 Claims, 5 Drawing Figures

U.S. Patent     Jul. 29, 1980     4,214,706
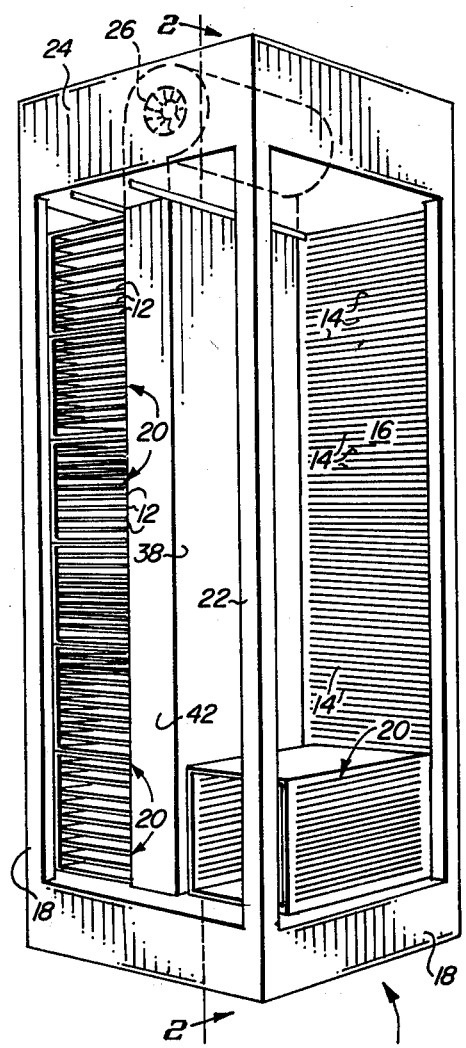
FIG-1
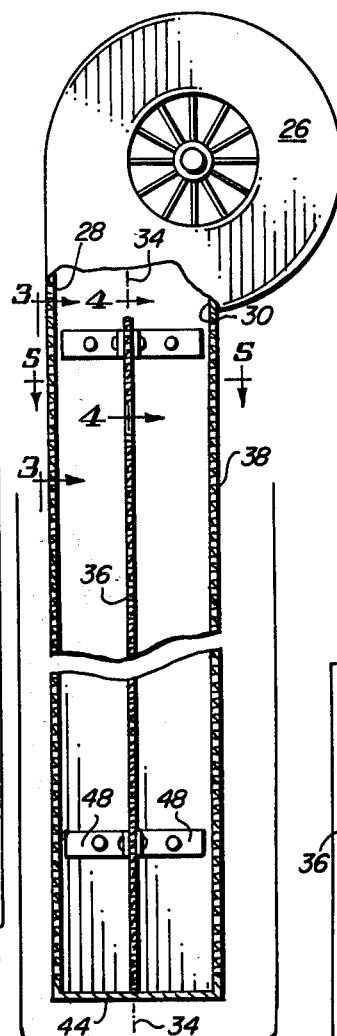
FIG-2
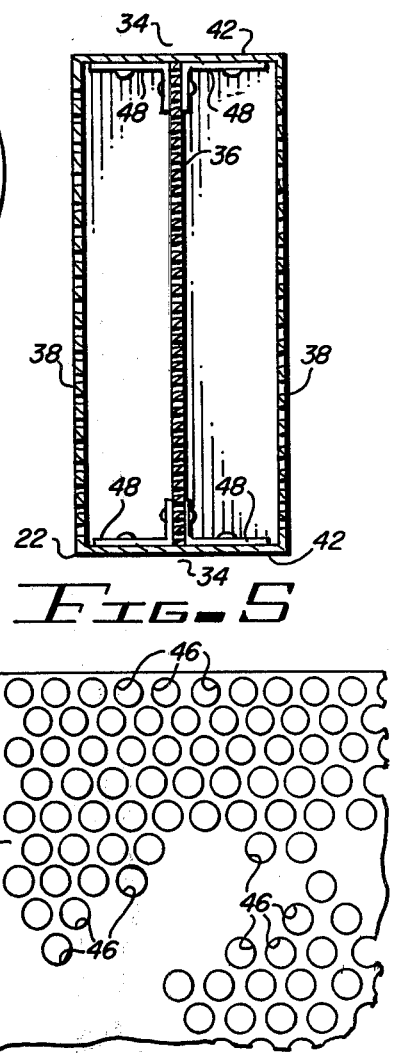
FIG-5
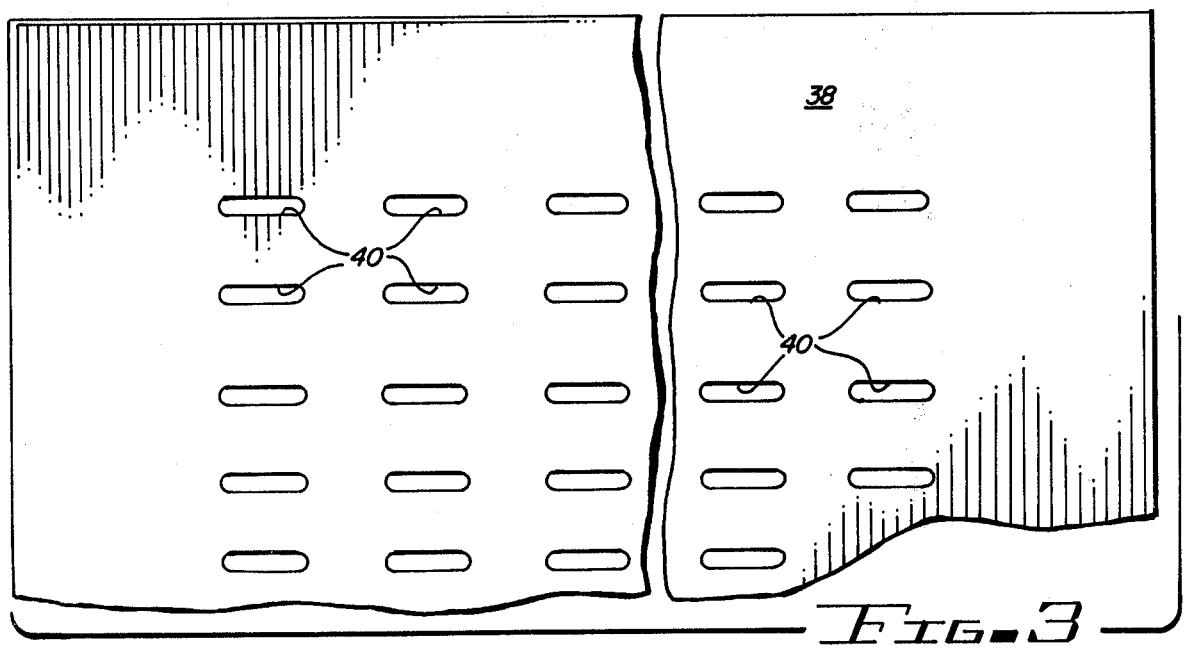
FIG-4
FIG-3

AIR DISTRIBUTION SYSTEM

BACKGROUND OF THE INVENTION

1. Field of the Invention

This invention is in the field of apparatus for controlling air flow through openings in the side walls of a pressurized plenum chamber, particularly, by a baffle that induces turbulent flow within the chamber, substantially dampens out oscillations in the flow of air within the chamber, and substantially equalizes pressure within the chamber so that there is no significant difference in the rate of flow of air through openings in the side walls of the plenum as a function of the position of the openings along the length of the plenum.

2. Description of the Prior Art

In large electronic systems such as digital data processing systems it is well known to cool the components that produce heat; semiconductor devices, resistors, power supplies, etc. by directing streams of air moving at a relatively high velocity over such devices. With the advent of medium and large scale integrated circuits, such circuits are frequently mounted on printed circuit boards which boards are in turn mounted on fixtures, or racks, so that large numbers of such boards can be positioned in close proximity to one another to facilitate electrical interconnections between boards. To provide the necessary quantity of air to cool the components mounted on these boards, an air duct, or plenum chamber, closed at one end is mounted in the cabinet in which the circuit boards with their components mounted on them are located. The plenum chamber is normally mounted vertically or horizontally, but in either arrangement perpendicular to the planes in which the printed circuit boards lie, and has essentially a uniform cross sectional area along its length. Air metering openings are formed in the side walls of the plenum chamber to direct air over the components to be cooled. An air pump provides the necessary quantity of cooling air and is usually connected to one end or the other of the plenum chamber with the other end of the chamber being closed.

The problem with prior art systems for distributing air to cool components in complex electrical systems is the result of increasing the amount of cooling air to be distributed by the system while maintaining the dimensions of the system, particularly the cross sectional area of the plenum chamber constant. Increasing the amount of air forced into plenum chamber per unit time results in an uneven distribution of air flowing through the metering slots in side walls of the plenum chamber as a function of the distance of such openings from the air pump. The velocity of air flowing through the metering slots at the more distant, or closed, end of the chamber is at a maximum and at a minimum through the metering slots nearest the pump. The reason for the variations in velocity flow through air metering openings of substantially the same size is due to the magnitude and direction of the velocity vector of the air as it enters the plenum chamber. The velocity vector is at its maximum magnitude at the entrance to the chamber and its direction is substantially parallel to the side walls so that the air flows through the air metering openings in the upper portion of the chamber only at a significantly reduced velocity. Near the closed end of the chamber the magnitude of the velocity vector approaches zero as its limit so that air flow can flow through the metering openings in the side walls in the lower portion of the chamber at a speed corresponding to the static pressure of the air in the chamber. In addition the air flow from the air pump, typically a centrifugal blower, does not have a constant velocity profile across the air stream produced. The air stream has a higher velocity center core which tends to bounce, or to be reflected, from the side walls of the plenum chamber so that oscillations, or oscillatory changes in pressure, occur within the chamber. This phenomena further exacerbates the uneven distribution of flow rates through the air metering openings along the length of the side walls of the plenum chamber. The variations in flow rates result in inadequate cooling of some components to the detriment of their reliable performance, particularly over a sustained period of time.

SUMMARY OF THE INVENTION

The present invention provides an improved baffle in an air distribution system including an air plenum chamber with air distribution, or metering, openings in its side walls, and an air pump for supplying a continuous stream of air under pressure to the chamber. The baffle is made from thin sheet material and is mounted substantially in the center of the plenum chamber and parallel to the side walls of the chamber. The baffle extends substantially the full length of the chamber. The thin sheet of material from which the baffle is made is provided with a large number of openings of substantially uniform size formed through it. The maximum area of the holes approaches 40 percent of the total cross sectional area of the baffle as a limit. The baffle occupies a very small part of the volume of the chamber so that it does not of itself significantly reduce the capacity of the chamber to transmit air from the pump to the devices to be cooled. The large number of openings through the baffle converts laminar flow of air from the pump to more turbulent flow and also tends to prevent laminar flow from being established in other parts of the chamber. The openings permit communication between the two sides of the chamber, but provide enough impedance to the movement of air through the baffle to dampen out oscillations that might be induced by the air stream entering the chamber. As a result of the functions of the baffle; i.e., inducing turbulent flow equalizing pressure, and damping oscillations; air flow through the air metering openings in the side walls of the plenum chamber is substantially constant and independent of the position of the air metering openings along the length of the chamber.

It is therefore an object of this invention to provide an improved air distribution system in which an improved baffle is positioned in the plenum chamber of the system, which baffle tends to inhibit laminar flow, damps out oscillations of the air flow within the chamber and substantially equalizes the pressure of the air within the chamber substantially throughout the chamber.

It is another object of this invention to provide an air distribution system for cooling electronic components in which the air flow through air flow metering openings in the side walls of the plenum chamber of such a system is substantially uniform throughout the length of the chamber.

It is yet another object of this invention to provide an improved baffle for an air distribution system, which baffle does not reduce the capacity of the system, is relatively low in cost, is easy to fabricate, and is easy to install.

BRIEF DESCRIPTION OF THE DRAWINGS

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure, and in which:

FIG. 1 is a perspective view of a cabinet of an electronic system provided with the air distribution system of the present invention.

FIG. 2 is a sectional view taken on lines 2—2 through the plenum of the air distribution system of FIG. 1.

FIG. 3 is an enlarged fragmentatry view of a portion of a metering plate of the plenum chamber.

FIG. 4 is an enlarged fragmentary view of the baffle of this invention.

FIG. 5 is a section taken on lines 5—5 of FIG. 2.

DETAILED DESCRIPTION OF THE INVENTION

In FIG. 1, cabinet 10 is designed to hold a large number of printed circuit boards 12 which are plugged into connectors 14. Connectors 14 are fixedly secured to backpanel 16. Cabinet 10 has a frame 18 to which is secured backpanel 16 and fixtures, or card cages 20 in which printed circuit boards 12 are held after they have been inserted into the connectors 14. In FIG. 1, printed circuit boards 12 and card cages 20 in the right hand half of the cabinet 10 are eliminated to provide a better view of plenum chamber 22 which is illustrated as being mounted vertically in cabinet 10, in the preferred embodiment. Attached to the upper portion of frame 18 is housing 24 in which a blower, or air pump, 26 is mounted. The outlet 28 of pump 26 is connected to the throat 30 of plenum chamber 22 to cause air to flow into the interior 32 of plenum chamber 22 as is best seen in FIG. 2.

Plenum chamber 22 has a substantially uniform cross sectional area from the top of chamber 22 to the bottom as can be seen in FIG. 2 so that it has a longitudinal plane of symmetry 34. Baffle 36 which is made of a thin sheet of material such as 16 gage cold-rolled low carbon steel is mounted in the interior of chamber 22 so that it substantially coincides with the plane of symmetry 34 of plenum chamber 22 and substantially divides the interior 32 of chamber 22 into two substantially equal portions. Plenum 22 has a pair of side walls, or metering plates, 38 which are provided with metering slots, or openings, 40 which permit air from the interior 32 of the plenum chamber 22 to escape and blow over electronic components mounted on printed circuit boards 12 positioned in card cage 20 in close proximity to the metering plates 38. Plenum chamber 22 also has end walls 42 and a bottom plate, or wall 44. The function of bottom wall 44 is to prevent air from flowing out through the open or bottom end of the plenum chamber 22.

In FIG. 4, details of baffle 36 can be seen. Baffle 36 is provided with a large number of substantially circular openings 46 which are substantially uniformly spaced and distributed throughout the length and breadth of baffle 36. Baffle 36 is, in the preferred embodiment, provided with brackets 48 which are secured to baffle 36 and can be fixedly secured to side walls 42 by rivets, for example, or the length of brackets 48 can be such that the baffle 36 is properly positioned within the plenum chamber 38 by brackets 48 so that baffle 36 will substantially coincide with the plane of symmetry 34 of chamber 22.

In the preferred embodiment side walls 38 are substantially planar and have the same dimensions and rectangular shape. The two end walls 42 are also substantially planar and have the same dimensions and rectangular shape. End walls 42 have the same length but different widths compared to side walls 38. Walls 38 and 42 are joined together to form plenum chamber 22 which has a substantially rectangular cross sectional area. In the preferred embodiment the plenum chamber is substantially 3 inches wide, 10 inches long and its height is approximately 69 inches. The metering slots 40 which are formed through side walls 38 are positioned to cause air to flow over electronic components mounted on printed circuit boards 12. The pattern, or arrangement, of metering slots 40 can be substantially as illustrated in FIG. 3. In a preferred embodiment, the length of each metering slot 40 is $\frac{3}{4}$ inch, the spacing between slots in a given row is $\frac{1}{4}$ inch and the spacing between rows of slots is $\frac{1}{2}$ inch. Also, in the preferred embodiment the size of the openings 46 in baffle plate 36 is $\frac{1}{8}$ inch, and there are twenty-nine of openings 46 per square inch. The ratio of the area of openings 46 to the area of baffle 36 is approximately 36 percent. In the preferred embodiment, blower 26 is a centrifugal blower having a capacity of 600 cubic feet per minute when the back pressure is substantially zero.

In operation the blower 26 will direct a stream of relatively high velocity air into the upper portions, or throat, 30 of plenum chamber 22. The presence of baffle 36 with its large number of openings 46, which baffle extends substantially the full length of chamber 22, induces turbulent flow in the air stream from pump 26 particularly in the upper portion of plenum chamber 42. As a result air will flow through the air metering slots 40 located in the upper portion of plenum chamber 22 at substantially the same velocity as air flowing through the metering slots 40 located near the bottom of plenum chamber 22. It is believed that the large number of small openings 46 tends to (1) induce turbulent flow, (2) dampen oscillations particularly transverse oscillation which, in the absence of baffle 36, would be induced by the high velocity stream of air entering throat 30 striking the side walls 38 of plenum chamber 22 and being reflected off of them. In addition the large number of holes 46 or the ratio of the area of the holes 46 to the total area of baffle 36 results in the pressure distribution in chamber 22 being substantially equal. The equalization of pressure within chamber 22 also helps to even out, or smooth out, variations in the velocity of the air flowing through each of the metering slots 40 in the metering, or side plates 38. Tests have been conducted with a plenum chamber 22 having the dimensions set forth above which has a cross sectional area of substantially 30 square inches, and produced measurements of air flowing through the metering slots substantially at around 400 feet per minute throughout the full length of plenum chamber 22.

Changes in the size and number of holes per unit area affects the efficiency of baffle 36. If openings 46 are too small, baffle 36 will act as if it were a solid plate and the benefits resulting from inducing turbulent flow, damping oscillations, and equalizing the pressure within chamber 22 are not achieved. If the openings are too big, then the turbulence induced by plate 36 and its damping function are reduced which will ultimately also result in the pressure distribution within chamber 22 and velocity of the air flowing through the metering slots at the upper portion of the plenum chamber being substantially less than that at the lower portion. Openings of ⅛ inch diameter with there being 29 such openings per square inch appear to be the optimum.

While the invention has been described and illustrated as if the blower 26 which is located at the top of the plenum chamber 22, the invention works equally well if blower 26 is located at the bottom of the plenum chamber 22 and the plenum chamber 22 is positioned horizontally. In addition while it is preferable for blower 26 to blow air into chamber 22 in a direction essentially parallel to side walls 38 this is not critical as baffle 36 will function as described if air from pump 26 enters plenum chamber 22 in a direction substantially perpendicularly to the plane of side walls 38.

It should be evident that various modifications can be made to the described invention without departing from the scope thereof.

What is claimed as our invention is:

1. An improved air distribution system comprising:
   planar walls forming a plenum chamber; said plenum chamber having a pair of ends, a substantially uniform cross section, and a plane of symmetry; two of said walls being substantially parallel to said plane of symmetry;
   end wall means closing one end of said chamber;
   planar baffle means having a surface area positioned in the plenum chamber so that it substantially lies in the plane of symmetry of the chamber, said baffle means having a large number of substantially small openings formed through it;
   air metering slots of substantially uniform size formed in the two planar walls substantially parallel to the plane of symmetry of the plenum chamber for directing air flow from within the chambers in a direction substantially normal to the wall means; and
   air pump means connected to the other end of the plenum chamber for forcing air into the plenum chamber.

2. The improved air distribution system of claim 1 in which the area of the openings formed through the baffle means is substantially in the range of from 30 to 40 percent of the surface area of the baffle means.

3. The improved air distribution system of claim 1 in which the area of the openings formed through the baffle means is substantially 36 percent of the surface area of the baffle means.

4. The improved air distribution system of claim 1 in which the small opening formed through the planar baffle means have diameters of substantially one eighth of an inch and the number of such openings is substantially in the range of 25–32 per square inch of the surface area of the baffle means.

5. The improved air distribution system of claim 1 in which the number of openings through the baffle means is substantially 29 per square inch of the surface area of the baffle means.

6. Improved air distribution apparatus comprising:
   four substantially planar rectangular walls, each wall having a length and a width, the length of the walls being substantially equal;
   said four walls being joined together to form an air duct of substantially uniform cross sectional area throughout the length of the duct, the length of the duct being the length of the four walls forming the duct, said duct having two ends;
   a fifth wall having an area substantially equal to the cross sectional area of the duct secured to one end of the duct to close that end, the other end of the duct adapted to be connected to an air pump for pumping air into the duct;
   means forming air metering slots through two of the four walls joined together to form the air duct; and
   substantially planar baffle means having a length and a width defining a surface area the length being substantially equal to the length of the air duct and the width being such that when mounted in the center of the duct, the baffle means substantially divides the duct into two substantially equal volumes with the baffle means being substantially parallel to the walls having means forming air metering slots through them, said baffle means having a large number of small circular openings formed through it.

7. The improved air distribution system of claim 6 in which the area of the openings formed through the baffle means is substantially in the range of from 30 to 40 percent of the surface area of the baffle means.

8. The improved air distribution system of claim 6 in which the area of the openings formed through the baffle means is substantially 36 percent of the surface area of the baffle means.

9. The improved air distribution system of claim 6 in which the small openings formed through the planar baffle means have diameters of substantially one eighth of an inch, and the number of such openings is substantially in the range of 25–32 percent square inch of surface area of the baffle means.

10. The improved air distribution system of claim 6 in which the number of openings through the baffle means is substantially 29 per square inch of surface area of the baffle means.

11. In an air distribution system having four rectangular planar walls, two of the walls being side walls and two end walls, said walls forming a plenum chamber of substantially rectangular cross sectional area, said chamber having two ends;
    means forming an air inlet opening substantially at one end of the chamber;
    wall means closing the chamber substantially at the other end;
    an air pump connected to the air inlet opening for supplying air under pressure to the interior of the chamber;
    means forming a plurality of air metering openings through two of the side walls; the improvements comprising:
    a rectangular thin planar wall having a surface area of substantially the same size as the side walls and positioned in the chamber parallel to the side walls and spaced substantially equally distant from the side walls and dividing the interior of the chamber into two substantially equal portions, a large number of openings formed through the wall to provide communication between the two portions of the interior of the chamber and to dampen out transverse oscillations in air pumped into the chamber, so that the air flow through the air metering openings in the side walls is substantially uniform throughout the length of the chamber.

12. The improved air distribution system of claim 11 in which the area of the openings formed through the baffle means is substantially in the range of from 30 to 40 percent of the surface of the baffle means.

13. The improved air distribution system of claim 11 in which the area of the openings formed through the baffle means is substantially 36 percent of the surface area of the baffle means.

14. The improved air distribution system of claim 11 in which the small openings formed through the planar baffle means have diameters of substantially one eighth of an inch and the number of such openings is substantially in the range of 25-32 per square inch of the surface area of the baffle means.

15. The improved air distribution system of claim 11 in which the number of openings through the baffle means is substantially 29 per square inch of the surface area of the baffle means.

* * * * *